United States Patent [19]
Kovacs et al.

[11] Patent Number: 4,835,739
[45] Date of Patent: May 30, 1989

[54] MASS STORAGE BUBBLE MEMORY SYSTEM

[75] Inventors: Eddie J. Kovacs, Kings Park; John C. Pereira, Commack, both of N.Y.

[73] Assignee: Grumman Aerospace Corporation, Bethpage, N.Y.

[21] Appl. No.: 81,829

[22] Filed: Aug. 4, 1987

[51] Int. Cl.[4] ............................................. G11C 19/08
[52] U.S. Cl. ...................................................... 365/1
[58] Field of Search ........................................ 365/1, 2

[56] References Cited

U.S. PATENT DOCUMENTS

| | | | |
|---|---|---|---|
| 3,678,478 | 7/1972 | Copeland, III | 365/27 |
| 3,742,471 | 6/1973 | Mikami | 365/1 |
| 3,864,671 | 2/1975 | Myer | 365/1 |
| 4,081,861 | 3/1978 | Linn | 365/2 |
| 4,091,362 | 5/1978 | Chen | 365/1 |
| 4,156,934 | 5/1979 | Burford et al. | 365/2 |
| 4,225,941 | 9/1980 | Moran | 365/1 |
| 4,270,186 | 5/1981 | Flannery | 365/15 |
| 4,287,568 | 9/1981 | Lester | 365/1 |
| 4,310,897 | 1/1982 | Lazzari | 365/1 |
| 4,326,267 | 4/1982 | Lazzari | 365/1 |
| 4,354,253 | 10/1982 | Naden | 365/15 |
| 4,400,795 | 8/1983 | Irie et al. | 365/1 |
| 4,445,199 | 4/1984 | Imazeki et al. | 365/1 |
| 4,459,679 | 7/1984 | Sukeda et al. | 365/1 |
| 4,459,680 | 7/1984 | Sukeda et al. | 365/1 |
| 4,481,606 | 11/1984 | Nozawa et al. | 365/1 |
| 4,485,458 | 11/1984 | Sukeda et al. | 365/1 |
| 4,495,601 | 1/1985 | Etch et al. | 365/1 |
| 4,498,152 | 2/1985 | Futami et al. | 365/1 |

OTHER PUBLICATIONS

Electronics—vol. 54, No. 9; May 5, 1981, pp. 149–151.

Primary Examiner—James W. Moffitt
Attorney, Agent, or Firm—Richard G. Geib; Daniel J. Tick; Bernard S. Hoffman

[57] ABSTRACT

A data storage system comprises a plurality of bubble memory chips each having a major loop and minor loops. At least one of the minor loops of each chip is used to store bad loop data for its respective chip. A system controller controls operation of the bubble memory chips. The system controller includes a chip controller for controlling operation of the bubble memory chips and a random access memory for storing the bad loop data from all of the bubble memory chips, and for supplying bad loop data to the chip controller so that data is placed only on operative loops of the bubble memory chips. A data transfer bus is used for inputting and outputting data from the system controller to a host computer. The system includes a plurality of bubble memory cassettes, each cassette having a predetermined number. Control signals are provided to the bubble memory chips of bubble memory chips so that more than one bubble memory chip is used simultaneously. A byte of data is stored and retrieved substantially simultaneously.

6 Claims, 3 Drawing Sheets

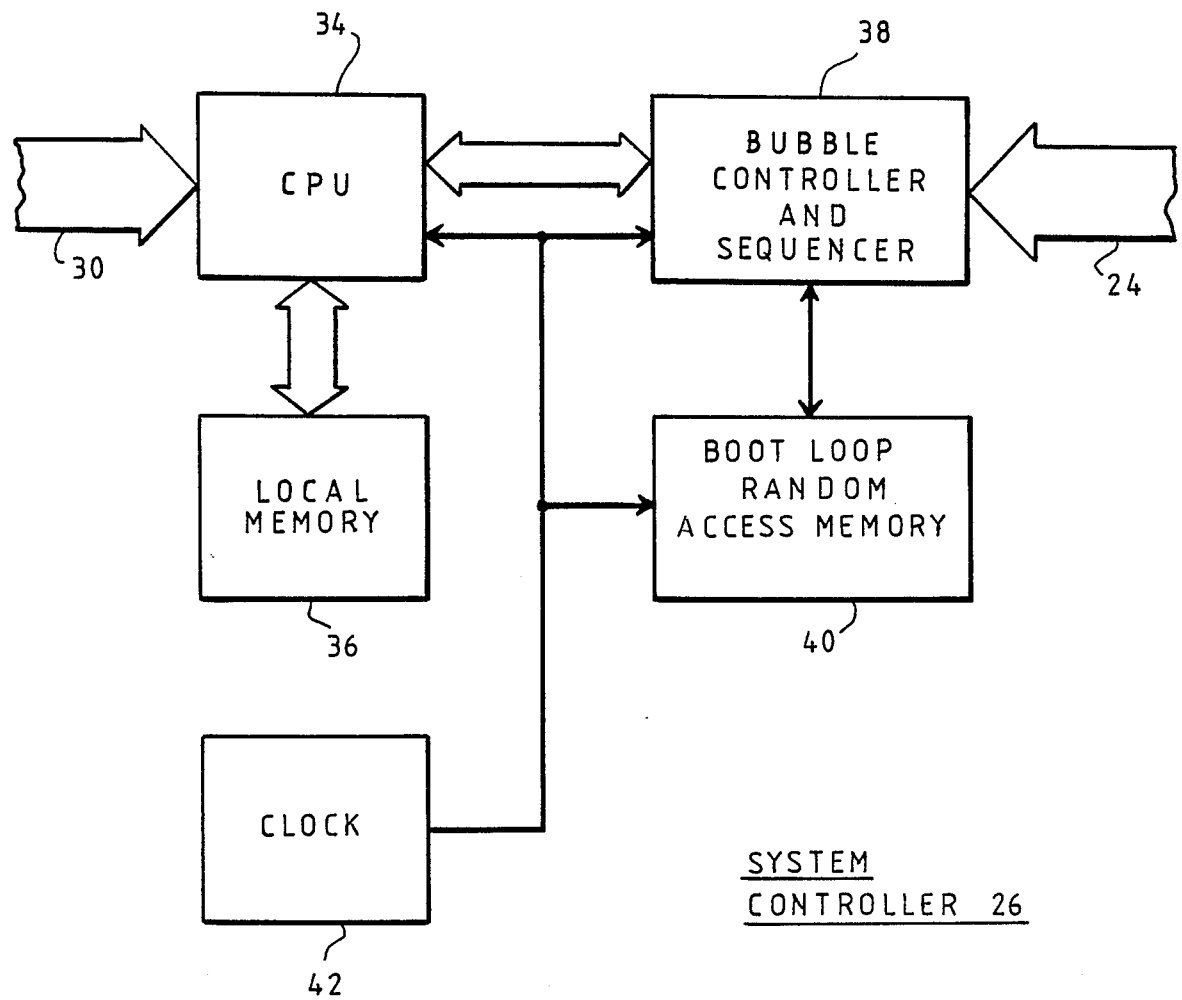
_Fig. 2_

MASS STORAGE BUBBLE MEMORY SYSTEM

BACKGROUND OF THE INVENTION

This invention relates to bubble memory systems. More particularly, this invention relates to bubble memory systems suitable for mass storage.

Bubble memories enjoy the advantage of having no mechanical or moving parts and therefore are considered to be of high reliability. However, costs have been relatively high and speed of operation for serial reading of data from a loop in a bubble memory has generally been rather low. For example, most bubble memories are limited to data read-out rates of approximately 12.5K bytes/second. This does not compare favorably to disc drives, which can read out data at rates of up to 500K bytes/second (significantly more than an order of magnitude faster). Thus, the preferred device for inexpensive mass storage in data processing systems has generally been a hard or floppy disc device.

In most applications, data is not read out continuously. Instead, relatively small blocks of data are read from various "pages" of the memory. Then a different portion of memory is accessed, and another relatively small block of data is read. Thus, a major limitation in the speed of operation of a computer system is the amount of time necessary to access the data in mass storage. For example, for a disc drive the time required to move the read head, permit it to stabilize in a new position with respect to the disc, and begin reading data, may be in the order of 50 msec. On the other hand, in a bubble memory device using bubble chips having a major loop and minor loops with 2,000 bits each, at a rate of 100K bits/second, the worst case access time for reading out data would be approximately twenty milliseconds (10 microseconds/bit × 2,000 bits) and the average access time would be approximately ten to twelve milliseconds. Thus, if the read out rate for bubble memories could be improved by a factor of just under an order of magnitude, bubble memories would favorably compete with disc drives in terms of overall speed of operation.

Bubble memory chips also have another disadvantage in that not all minor loops on a bubble memory chip are usable. When a chip is tested over the full range of operating temperatures, generally a small percentage of the loops fail to perform properly. The use of these loops would introduce unacceptable errors into the data.

Generally, at the factory, data concerning which loops are inoperative is written into certain of the loops (which must test good at the factory). This bad loop data (BLD) is stored in "boot loops" on the chip. It is also recorded on the outside of the chip so that the data can be written back on to the boot loops should it become necessary to erase and reload all of the information on the chip.

The BLD is used to instruct a memory system controller to avoid writing data into and reading data from the bad loops. Generally, the BLD for a single chip is accessed on the chip and is loaded into a memory associated with the controller for only that chip.

In mass storage systems, many chips may be used. A central controller must access and use the BLD of many chips. When the controller switches from one chip to another, the BLD for the new chip must be accessed, and then supplied to the controller. This additional access time interferes with the operation of the system and tends to make the system less desirable.

SUMMARY OF THE INVENTION

It is a principal object of the invention to provide a mass storage bubble memory system with relatively low access time to stored data.

It is another object of the invention to provide a mass storage bubble memory system which stores all of the bad loop data of all of the bubble memory chip used therein in a memory in the system controller.

It is yet another object of the invention to provide a mass storage bubble memory system wherein the bad loop data stored in the memory may be easily changed when the bubble memory chips used in the system are changed.

In accordance with the invention, a data storage system comprises a plurality of bubble memory chips, each having a major loop and minor loops. At least one of the minor loops of each chip is used to store bad loop data for its respective chip. A system controller controls operation of the bubble memory chips. The system controller includes chip control means for controlling operation of the bubble memory chips and a random access memory means for storing the bad loop data from all of the bubble memory chips, and for supplying bad loop data to the chip control means so that data is placed only on operative loops of the bubble memory chips. A data transfer means for inputting data to be stored to, and outputting data stored from the system controller is provided.

The system controller is configured so as to receive the bad loop data serially. The random access memory means comprises a random access memory, and a counter responsive to a clock. The counter produces a sequence of addresses in response to pulses from the clock to sequentially access addresses in the random access memory, whereby data in the random access memory is supplied serially to the system controller.

The system preferably comprises a plurality of bubble memory cassettes. Each cassette houses a predetermined number of bubble memory chips.

The chip control means includes driving means for providing control signals so that more than one bubble memory chip is used simultaneously. A byte of data is simultaneously stored or retrieved, thus enhancing the speed of operation of the memory system.

BRIEF DESCRIPTION OF THE DRAWINGS

In order that the invention may be readily carried into effect, it will now be described with reference to the accompanying drawings, where:

FIG. 2 is a block diagram of the system controller of the system of FIG. 1; and

DETAILED DESCRIPTION OF THE PREFERRED EMBODIMENT

Although the present invention is described with respect to a 64M byte mass bubble memory system using eight plug-in bubble memory cassettes, it will be recognized that other system arrangements and architectures may be used.

Figure 1:
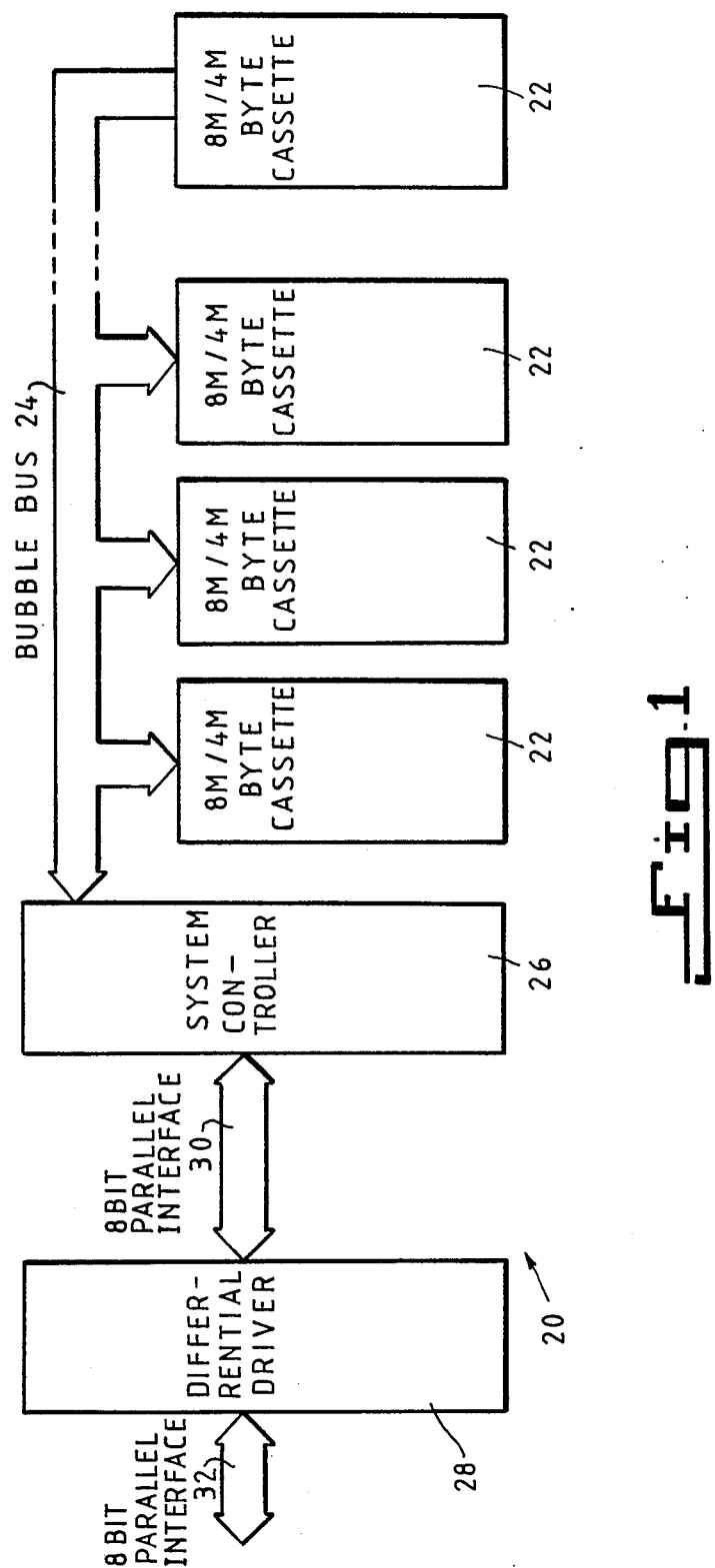
FIG. 1 is a system block diagram of a mass storage bubble memory system according to the invention.

Referring to FIG. 1, the bubble memory system 20 according to the invention includes a plurality of bubble memory cassettes 22 which fit into slots in a rack (not shown) so that an electrical connector (not shown) at the back of each cassette engages a mating electrical connector on a circuit board (not shown) which includes thereon a bubble bus 24.

Cassettes 22 preferably each contain two circuit boards on which are mounted eight bubble memory chips each and the appropriate circuit elements and chips needed to interface to the bubble memory chips. The bubble memory chips are preferably 4M bit memory chips sold by Fujitsu Limited as part number FBM64DA, but other chips, including a larger number of chips with smaller memory capacity on each chip, may be used. The above-mentioned chips are divided into four sections each. Each section has a major loop and 584 minor loops which each store 2,053 bits of data. Of these 524 are used. Sixty of the loops are either inoperative over the entire range of temperatures over which the chips must function (bad loops) or are assigned to be inoperative, so that only 524 loops are used to store data. Two of these 524 (known to be operative) are used to store the bad loop data, that is the data concerning which loops are bad or are assigned as bad.

Since each circuit board (not shown) in a cassette 22 carries eight chips, the memory capacity of a board is 4M bytes. Since there may two boards in each cassette, the total memory capacity of a cassette may be 8M bytes (or 4M bytes if only one board is used). If two boards are used in each cassette and eight cassettes are used, the system has a memory capacity of 64M bytes. Each board contains the components necessary to permit control of the bubble memory chips by a bubble memory system controller 26 connected to bubble cassettes 22 by bubble memory bus 24.

System controller 26 is connected to a differential driver 28 by an eight bit parallel interface 30. Differential driver 28 is of a type well known in the art and uses RS-422 differential drivers and receivers, thus permitting cables of reasonable length (up to several hundred feet if necessary) to be used to interface system 20 to a host computer system (not shown) by way of interconnection bus 32, when low impedance (110 ohm) terminators are used.

Interconnection bus 32 has eight single bit data lines for carrying data from the host computer system to differential driver 28, eight single bit data lines for carrying data from differential driver 28 to the host computer system, parity bits, address lines necessary for accessing all 64M bytes of data, a chip select line, a read line, a write line, a reset line, a transfer acknowledge line, a transfer request line, and an interrupt line.

Parallel interface 30 is an eight bit TTL bidirectional data bus which terminates at tristate devices (not shown) in system controller 26 and differential driver 28 and serves to transfer data from one to the other.

Referring to FIG. 2, system controller 26 has a central processing unit or CPU 34 which is coupled to parallel interface 30 through the tristate devices. CPU 34, which may be a type 6809 microcomputer, has an associated local memory 36 which includes a scratch pad random access portion and a read only portion. The read only portion is advantageously a type 27128 erasable programmable read only memory or EPROM which contains stored instructions to enable CPU 34 to control a bubble memory controller/sequencer 38 which is preferably constructed using a controller chip of type MB60H711 and a sequencer chip of type MB60H712. The bubble memory controller/sequencer 38 is connected to each of bubble memory cassettes 22 by way of bubble memory bus 24.

It will be understood that each cassette 22, when plugged into its respective cassette holder (not shown) so as to be electrically connected to bubble memory bus 24 by an electrical connector at its rear (not shown), due to its electrical presence on the bus, provides an indication to CPU 34 defining system configuration, i.e. the number of cassettes 22 plugged into bubble memory system 20. This is done by conventional means, such as by a sense line which extends to the connector, being shorted to ground when a cassette 22 is present. In a similar manner, each cassette 22 may have means for indicating whether it contains one circuit board (4M bytes of memory space is available) or two circuit boards (8M bytes is available).

After all cassettes 22 which are to be used at a given time are loaded into the system (connected to bus 24), the system is powered up. CPU 34 then causes bubble memory controller/sequencer 38 to access the BLD and provides the BLD to a boot loop random access memory or BL RAM 40. Although this is a time consuming procedure, requiring up to two seconds, it will be recognized that this delay is not of operational significance, as it occurs only when the system is first turned on and not during subsequent operation. The operations of CPU 34, bubble memory controller/sequencer 38 and BL RAM 40 are synchronized by a clock 42, which is of importance in the operation of BL RAM 40, as described below with respect to FIG. 3.

To increase speed of operation of the bubble memory system over that of a single bubble memory by almost an order of magnitude, the bubble memory controller/sequencer 38 interleaves access to all sections of two of the FBM64DA bubble chips on one of the two boards in each cassette 22 during each access cycle of the bubble memory chips. This permits the transfer to or from memory of eight bits of data in the same time usually required to access one bit, thus achieving a data transfer rate which, as noted above, makes the bubble memory system of the present invention competitive and even superior in speed to disc memory systems, because the average access time to required data is lower for the bubble memory system.

Figure 3:
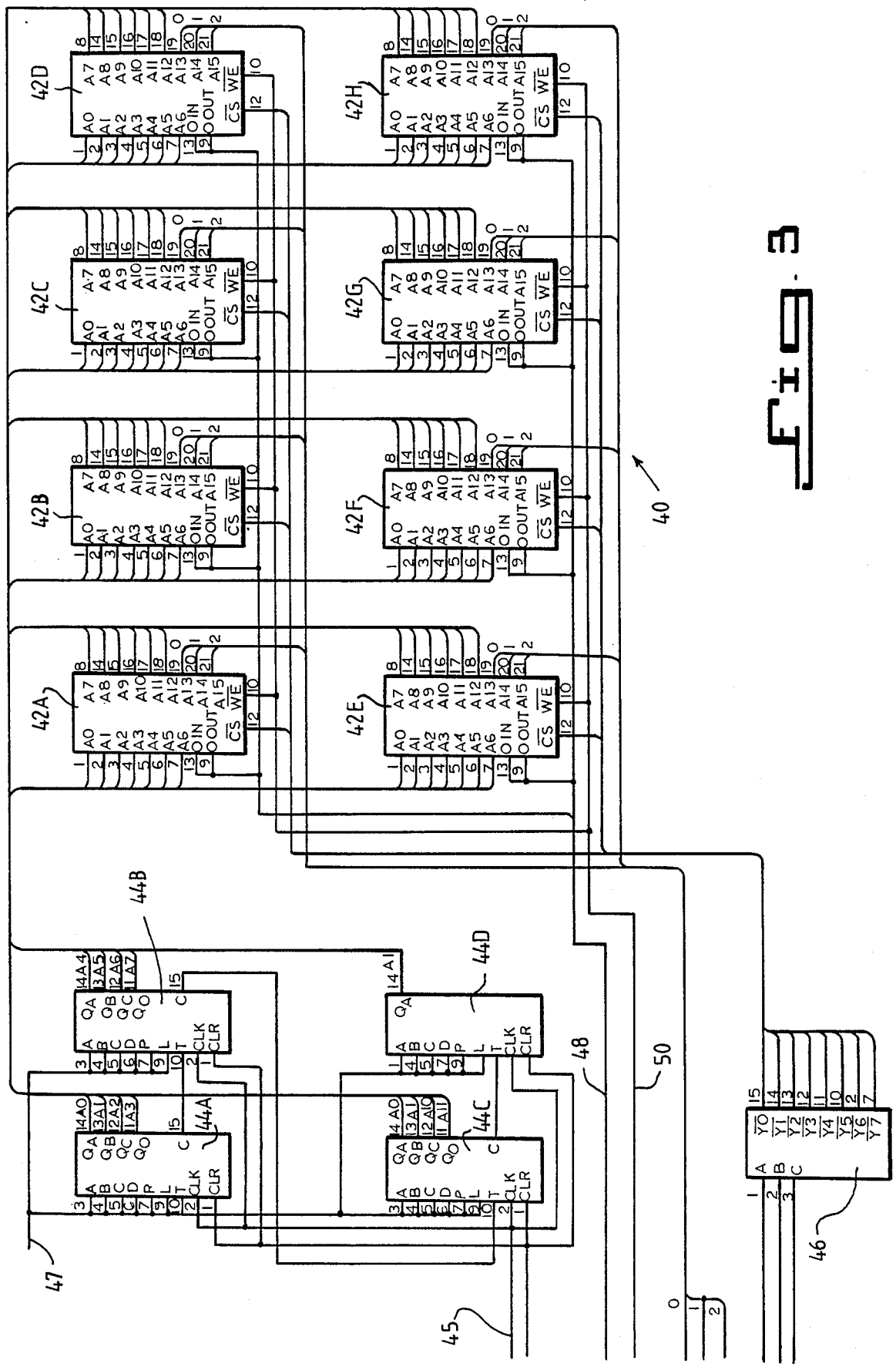
FIG. 3 is a schematic diagram of the random access memory of the system controller of FIG. 2.

Referring to FIG. 3, BLD RAM 40 includes eight type MH6287P-70 static RAM chips 42A to 42H which have a memory capacity of 64K bits in one bit segments addressed by sixteen address line inputs AO to A15. The address lines to RAM chips 42A to 42H are connected to the Q outputs of four counter chips 44A, 44B, 44C and 44D which may be of type TC74HC161P. More specifically, the QA to QD outputs of counter chip 44A provide the AO to A3 address bits, respectively. The QA to QD outputs of counter chip 44B provide the A4 to A7 address bits. The QA to QD outputs of chip 44C provide the A8 to A11 address bits. The QA output of chip 44D provides the A12 address bit.

The A13 to A15 address bits are provided by CPU 34 (FIG. 2). The useful storage space of each RAM chip 42A to 42E is divided into eight portions, as selected by the values of the A13 to A15 address bits (the most significant bits). The BLD from two of the FBM64DA bubble memory chips in a cassette is stored, with room to spare, in one of these eight portions.

When an eight bit word or byte of data is being written into or read out of memory, the BLD for the two FBM64DA bubble chips used (4 bits to each chip) is sequentially available as clock pulses are supplied, by way of a line 45, to the CLK inputs of counter chips 44A to 44D to increment the value of the A0 to A12 address bits (the 13 least significant bits). This permits CPU 34 to control bubble memory controller/sequencer 38 so that no data is written into bad loops and so that no attempt is made to read data back from bad loops.

The A, B, C and D data inputs and the P and L inputs of counter chips 44A to 44D are all tied to a control line 47 from CPU 34 so that the counter chips 44A to 44D can be reset as required, to facilitate writing the BLD into RAM chips 42A to 42M, when the system is powered up, or reading the BLD back when storing or retrieving data in the bubble chips in cassettes 22.

The CLR inputs of counter chips 44A to 44D are connected to a power on reset signal. The carry or C output of counter chip 44A is connected to the T input of chip 44B, the C output of chip 44B to the T input of chip 44C and the C output of chip 44C to the T input of chip 44D. Thus, chips 44A to 44D are configured as a 13 bit binary counter.

When the count provided by counter chips 44A to 44D is being incremented, BLD is written into or read from one of RAM chips 42A to 42H which, as noted above, each service one cassette 22. A decoder 46 decodes the logic signals supplied on three lines to its inputs A, B and C to supply a logic signal at one of outputs Y0 to Y7 for each combination of logic signals at inputs A, B and C. Outputs Y0 to Y7 are each connected to the chip select input of one of RAM chips 42A to 42H.

The data inputs DIN and data outputs DOUT of all of RAM chips 42A to 42H are all electrically connected together and to a data line 48. Data line 48 is used to provide the BLD from CPU 34 to RAM chips 42A to 42H for storage when a BLD write enable line 50, also from CPU 34, is in a first logic state. Line 50 is connected to the write enable input WE of each one of RAM chips 42A to 42H. When CPU 34 is reading BLD back from one of RAM chips 42, along line 48, line 50 is in a second logic state which does not permit data to be written into RAM chips 42A to 42H.

Although shown and described in what is believed to be the most practical and preferred embodiment, it is apparent that departures from the specific method and designs described and shown will suggest themselves to those skilled in the art and may be made without departing from the spirit and scope of the invention. We, therefore, do not wish to restrict ourselves to the particular construction described and illustrated, but desire to avail ourselves of all modifications that may fall within the scope of the appended claims.

What is claimed is:

1. A data storage system comprising
a plurality of bubble memory chips, each chip having a major loop and minor loops, at least one of said minor loops storing bad loop data for its respective chip;
a system controller for controlling operation of said bubble memory chips, said system controller including chip control means for controlling operation of said bubble memory chips and random access memory means initially storing said bad loop data from all said bubble memory chips and supplying said bad loop data to said chip control means so that data is placed only on operative loops of said bubble memory chips, said chip control means comprising a microprocessor, a memory for storing instruction for said microprocessor and access means for providing control signals to said bubble memory chips so that more than one bubble memory chip is used simultaneously; and
data transfer means for inputting data to be stored to, and outputting stored data from, said system controller.

2. The data storage system of claim 1, wherein said system controller is configured so as to receive said bad loop data serially and said random access memory means comprises
a random access memory and
a counter responsive to a clock, said counter producing a sequence of addresses in response to pulses from said clock for sequentially accessing addresses in said random access memory, whereby data in said random access memory is supplied serially to said system controller.

3. The data storage system of claim 2, wherein said random access memory includes a plurality of random access memory chips, each said random access memory chip storing bad loop data of a predetermined number of said bubble memory chips.

4. The data storage system of claim 3, further comprising a plurality of bubble memory cassettes, each cassette housing a predetermined number of said bubble memory chips, each said random access memory chip storing the bad loop data of the bubble memory chips in one of said cassettes.

5. The data storage system of claim 1, wherein said chip control means includes access means for providing control signals to said bubble memory chips so as to store substantially simultaneously, a byte of data.

6. The data storage system of claim 1, wherein said chip control means includes access means for providing control signals to said bubble memory chips so as to store a byte of data during each access cycle of the bubble memory chips.

* * * * *